US007112988B2

(12) United States Patent
Xiao

(10) Patent No.: US 7,112,988 B2
(45) Date of Patent: Sep. 26, 2006

(54) SYSTEM OF SIMULATING RESISTIVE LOADS

(75) Inventor: Ren-Jun Xiao, Shenzhen (CN)

(73) Assignee: Hon Hai Precision Industry Co., Ltd. (TW)

( * ) Notice: Subject to any disclaimer, the term of this patent is extended or adjusted under 35 U.S.C. 154(b) by 0 days.

(21) Appl. No.: 11/204,568

(22) Filed: Aug. 16, 2005

(65) Prior Publication Data
US 2006/0044005 A1 Mar. 2, 2006

(30) Foreign Application Priority Data
Aug. 24, 2004 (CN) .................. 2004 1 0051260

(51) Int. Cl.
G01R 31/36 (2006.01)

(52) U.S. Cl. ..................................... 324/771

(58) Field of Classification Search ................ 324/771, 324/765, 158.1, 434, 649, 439, 522, 73.1
See application file for complete search history.

(56) References Cited

U.S. PATENT DOCUMENTS 5,397,999 A * 3/1995 Kanamaru ................... 324/771
5,525,913 A * 6/1996 Brooks et al. ............... 324/771
5,705,905 A * 1/1998 Wood .......................... 318/490
6,639,409 B1 * 10/2003 Morimoto et al. ........... 324/434

FOREIGN PATENT DOCUMENTS

CN          93205293.2          12/1993

* cited by examiner

Primary Examiner—Minh Nhut Tang
Assistant Examiner—Tung X. Nguyen
(74) Attorney, Agent, or Firm—Morris Manning & Martin LLP; Tim Tingkang Xia, Esq.

(57) ABSTRACT

A system of simulating resistive loads adapted for testing working characteristics of power supplies includes a power supply (100), a linking apparatus (10) and a resistance loading apparatus (40). The power supply has a plurality of outputs (120). The linking apparatus is electrically connected to the outputs of the power supply. The resistive load apparatus is electrically connected to the linking apparatus. The resistive load apparatus includes a plurality of resistance matching selectors.

16 Claims, 3 Drawing Sheets

SYSTEM OF SIMULATING RESISTIVE LOADS

BACKGROUND OF THE INVENTION

1. Field of the Invention

The present invention relates to systems of simulating resistive loads, and particularly to a system of simulating resistive loads for testing performance of power supplies.

2. General Background

Conventionally, most of electronic apparatuses are not equipped power supplies themselves on account of volumes and costs. The electronic apparatuses need outer power supplies to offer electrical energy. The power supplies can affect performance of the electronic apparatuses.

Currently, the power supplies have no same standard. Dissimilar electronic apparatuses have dissimilar power supplies. An improper use of a power supply to an electronic apparatus will likely damage the electronic apparatus. Power supplies must be tested before being used to electronic apparatuses. Resistances are always used to simulate loadings of electronic apparatuses.

What is needed is to provide a system of simulating resistive loads which conveniently tests performance of power supplies.

SUMMARY

A system of simulating resistive loads adapted for testing working characteristics of power supplies includes a power supply, a linking apparatus and a resistance loading apparatus. The power supply has a plurality of outputs. The linking apparatus is electrically connected to the outputs of the power supply. The resistive load apparatus is electrically connected to the linking apparatus. The resistive load apparatus includes a plurality of resistance matching selectors.

Other objects, advantages and novel features of the invention will become more apparent from the following detailed description when taken in conjunction with the accompanying drawings, in which:

DETAILED DESCRIPTION OF THE EMBODIMENT

Figure 1:
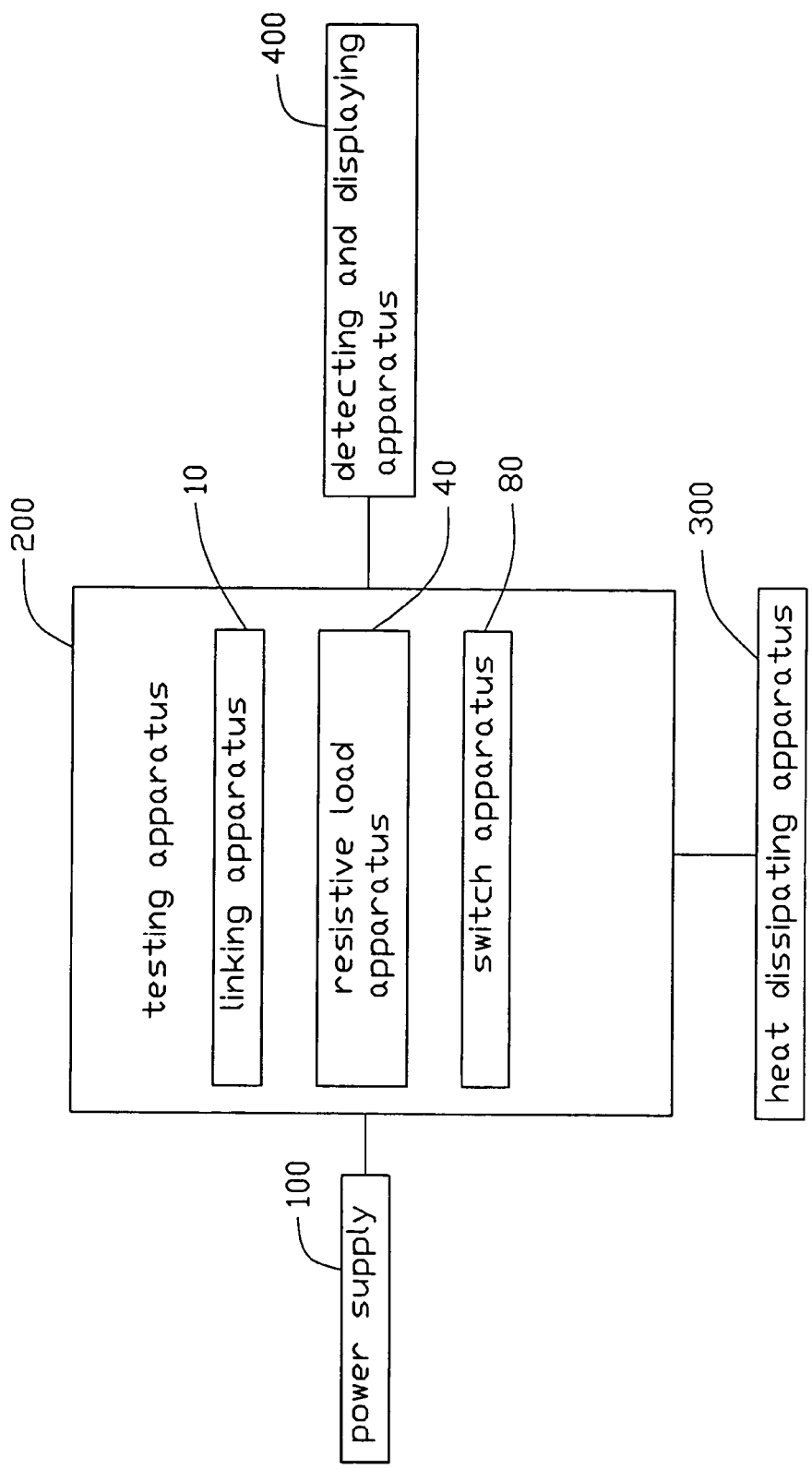
FIG. 1 is a block diagram of a system of simulating resistive loads in accordance with a preferred embodiment of the present invention.

Referring to FIG. 1, a system of simulating resistive loads in accordance with a preferred embodiment of the present invention is shown for testing performance of power supplies. The system of simulating resistive loads includes a power supply 100, a testing apparatus 200, and a detecting and displaying apparatus 400. The power supply 100 is electrically connected to the testing apparatus 200. The detecting and displaying apparatus 400 is also electrically connected to the testing apparatus 200.

The power supply 100 can be a switch power supply, an AC adaptor or a DC switch. The power supply 100 is a switch power supply in the preferred embodiment of the present invention.

Figure 2:
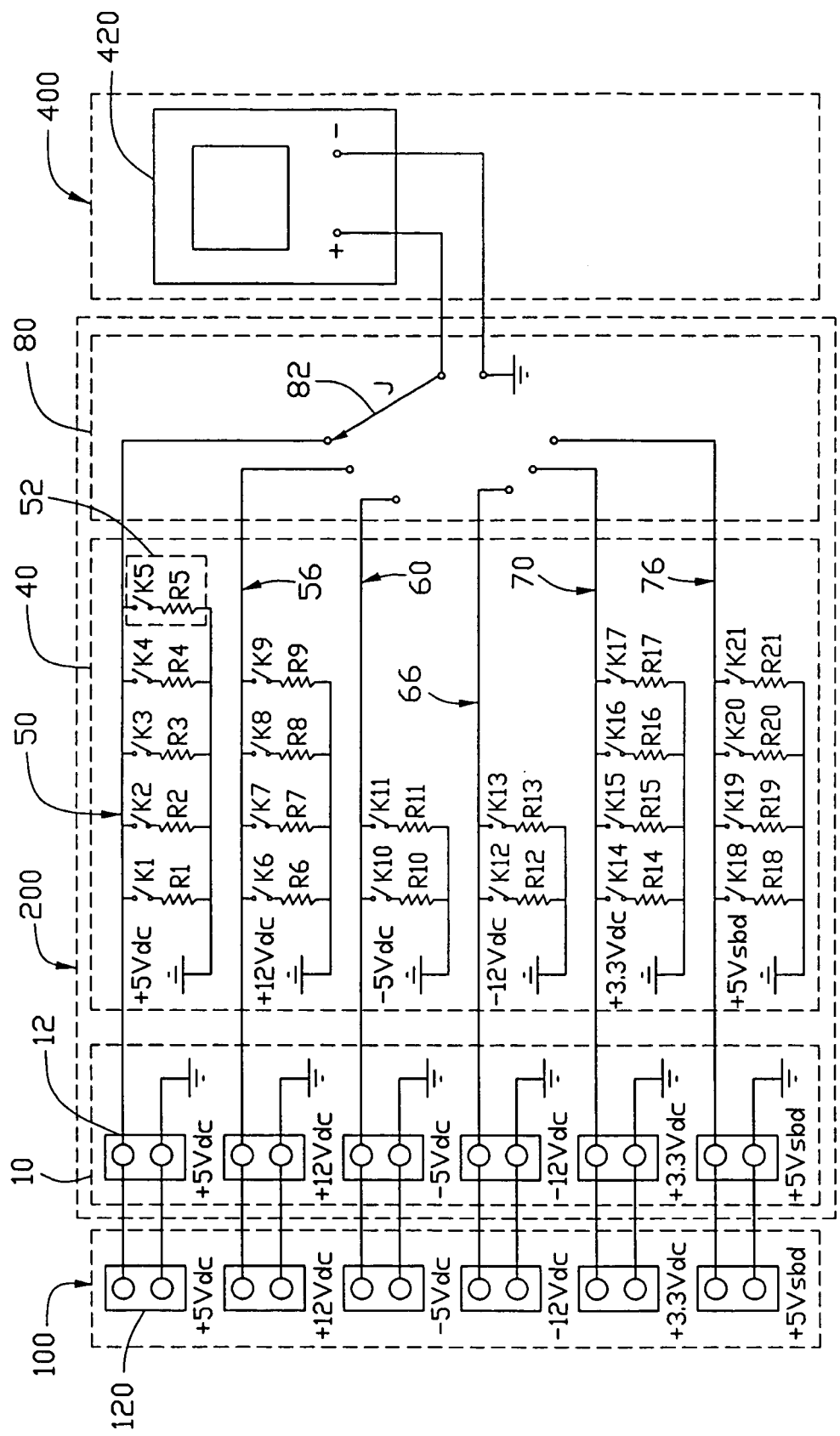
FIG. 2 is a circuit diagram of the system of simulating resistive loads of FIG. 1.

Referring also to FIG. 2, the power supply 100 includes a plurality of outputs 120. The outputs 120 offer computer systems different voltages, such as $+5V_{dc}$, $+12V_{dc}$, $-5V_{dc}$, $-12V_{dc}$, $+3.3V_{dc}$, $+5V_{sbd}$, etc., as a character of the power supply 100.

The testing apparatus 200 includes a linking apparatus 10, a resistive load apparatus 40 and a switch apparatus 80. The linking apparatus 10 is electrically connected all or parts of the outputs 120 of the power supply 100, and is electrically connected to the resistive load apparatus 40. The linking apparatus 10 includes a plurality of connectors 12. The resistive load apparatus 40 offers the power supply 100 correct resistive loads. The resistive load apparatus 40 includes a plurality of resistance matching selectors (50, 56, 60, 66, 70, 76). Each resistance matching selector includes a plurality of shunt-wound resistance units 52. Each resistance unit 52 includes a switch K and a resistance R. In the preferred embodiment, the resistive load apparatus 40 offers simulating resistive loads to $+5V_{dc}$, $+12V_{dc}$, $-5V_{dc}$, $-12V_{dc}$, $+3.3V_{dc}$, $+5V_{sbd}$, etc. The resistive load apparatus 40 includes six resistance matching selectors 50, 56, 60, 66, 70, 76 corresponding to the different six voltages $+5V_{dc}$, $+12V_{dc}$, $-5V_{dc}$, $-12V_{dc}$, $+3.3V_{dc}$, $+5V_{sbd}$. The resistance matching selectors 50, 56, 60, 66, 70, 76 have different amounts and parameters of the resistance units 52, as shown below:

| Voltages | Resistive loads | Currents |
| --- | --- | --- |
| $+5\,V_{dc}$ | 5 Ω | 1 A |
|  | 2.5 Ω | 2 A |
|  | 1.25 Ω | 4 A |
|  | 0.625 Ω | 8 A |
|  | 0.3125 Ω | 16 A |
| $+12\,V_{dc}$ | 12 Ω | 1 A |
|  | 6 Ω | 2 A |
|  | 3 Ω | 4 A |
|  | 1.5 Ω | 8 A |
| $-5\,V_{dc}$ | 25 Ω | 0.2 A |
|  | 10 Ω | 0.5 A |
| $-12\,V_{dc}$ | 60 Ω | 0.2 A |
|  | 24 Ω | 0.5A |
| $+3.3\,V_{dc}$ | 3.3 Ω | 1 A |
|  | 1.65 Ω | 2 A |
|  | 0.83 Ω | 4 A |
|  | 0.416 Ω | 8 A |
| $+5\,V_{sbd}$ | 25 Ω | 0.2 A |
|  | 12.5 Ω | 0.4 A |
|  | 6.25 Ω | 0.8 A |
|  | 3.125 Ω | 1.6A |

A most current of the resistive load apparatus 40 is 31 ampere(A). 31A is large enough to satisfy all types of power supplies, so the resistive load apparatus 40 is likely suit all types of power supplies.

The switch apparatus 80 electrically connected to the resistive load apparatus 40 is to transform signals from the resistive load apparatus 40 to the detecting and displaying apparatus 400. The switch apparatus 80 is a switch-type electric component. In the preferred embodiment, the switch apparatus 80 is a multiway switch. The switch apparatus 80 includes a plurality of multiway connectors and an option connector 82. The multiway connectors are electrically connected with the corresponding resistance matching selectors 50, 56, 60, 66, 70, 76, respectively. The option connector 82 is electrically connected with the detecting and displaying apparatus 400.

The detecting and displaying apparatus 400 is used to detect and display parameters of voltages, currents and power of the power supply 100. The detecting and displaying apparatus 400 includes an instrument 420 displaying detecting results. The instrument 420 can be a multimeter or an oscillograph, etc. The instrument 420 includes two conductive wires. One of the conductive wires is connected with the option connector 82 of the switch apparatus 80. The other one of the conductive wires is grounded.

In working, a correct resistance load of the resistance loading apparatus is selected. The correct resistance load is equal to a resistance of an electric apparatus (not shown) that will use the power supply 100. For example, some types of power supplies having an output voltage of $+5V_{dc}$ have a most current 20A. The resistance matching selector 50 of $+5V_{dc}$ is selected. Resistance units 52 of 4A and 16A are selected and the corresponding switches Ks are turned on. The option connector 82 of the switch apparatus 80 is connected to the corresponding resistance matching selector 50. The detecting and displaying apparatus 400 tests working characteristics of the 20A and identifies whether the 20A satisfies the electric apparatus.

Figure 3:
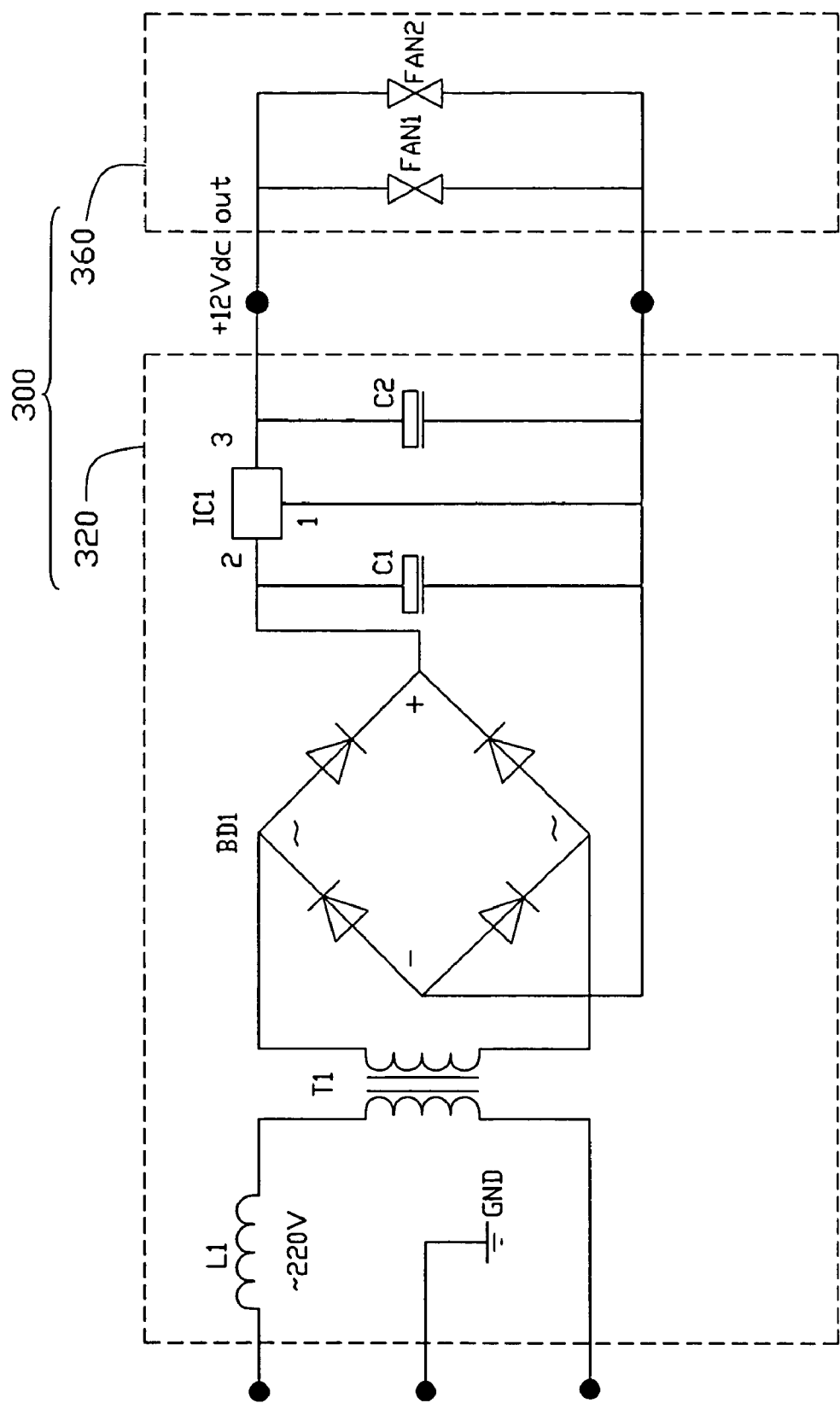
FIG. 3 is a circuit diagram of a heat dissipating apparatus of the system of simulating resistive loads of FIG. 1.

Referring also to FIG. 3, the testing apparatus 200 inevitably produces a lot of heat. Thus, a heat dissipating apparatus 300 is connected to the testing apparatus 200. The heat dissipating apparatus 300 includes an alternating current commutating part 320 and a heat dissipating part 360. The alternating current commutating part 320 converts $+220V_{ac}$ to $+12V_{dc}$. $+12V_{dc}$ is offered to the heat dissipating part 360 after being filtered by capacitances C1 and C2. The heat dissipating part 360 includes two fans FAN1 and FAN2.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A system of simulating resistive loads adapted for testing working characteristics of power supplies, the system of simulating resistive loads comprising:
    a power supply having at least an output;
    a linking apparatus electrically connected to said output of the power supply; and
    a resistive load apparatus electrically connected to the linking apparatus, the resistive load apparatus comprising at least one resistance matching selector, wherein
    the power supply comprises a plurality of outputs, the linking apparatus comprises a plurality of connectors electrically connecting to the outputs, respectively;
    the resistive load apparatus comprises a plurality of resistance matching selectors connected to the connectors, respectively; and
    each of the resistance matching selectors comprises a plurality of shunt-wound resistance units, each of the resistance units comprises a switch in series with a resistance, the switch is electrically connected to the linking apparatus, the resistance is grounded.

2. The system of simulating resistive loads as claimed in claim 1, further comprising a detecting and displaying apparatus being used to detect and display parameters of voltages, current, and power of the power supply.

3. The system of simulating resistive loads as claimed in claim 2, further comprising a switch apparatus, wherein the switch apparatus is a multiway switch comprising a plurality of multiway connectors and an option connector, the multiway connectors are electrically connected with the corresponding resistances matching selectors respectively, the option connector is electrically connected with the detecting and displaying apparatus.

4. The system of simulating resistive loads as claimed in claim 3, wherein the detecting and displaying apparatus comprises an instrument displaying the parameters, the instrument includes two conductive wires, one of the conductive wires is electrically connected to the option connector, the other one of the conductive wires is grounded.

5. A system of simulating resistive loads adapted for testing working characteristics of power supplies, the system of simulating resistive loads comprising:
    a power supply having a plurality of outputs; and
    a testing apparatus, comprising:
        a linking apparatus comprising a plurality of connectors electrically connected to the outputs, respectively; and
        a resistive load apparatus comprising a plurality of resistance matching selectors electrically connected to the connectors respectively, each of the resistance matching selectors comprising a plurality of shunt-wound resistance units, each of the resistance units comprising a switch in series with a resistance, wherein the switch is electrically connected to a corresponding connector of the linking apparatus, the resistance is grounded.

6. The system of simulating resistive loads as claimed in claim 5, further comprising a detecting and displaying apparatus being used to detect and display parameters of voltages, current, and power of the power supply.

7. The system of simulating resistive loads as claimed in claim 6, further comprising a switch apparatus, wherein the switch apparatus is a multiway switch comprising a plurality of multiway connectors and a option connector, the multiway connectors are electrically connected with the corresponding resistances matching selectors respectively, the option connector is electrically connected with the detecting and displaying apparatus.

8. The system of simulating resistive loads as claimed in claim 7, wherein the detecting and displaying apparatus comprises an instrument displaying the parameters, the instrument includes two conductive wires, one of the conductive wires is electrically connected to the option connector, the other one of the conductive wires is grounded.

9. The system of simulating resistive loads as claimed in claim 5, wherein a heat dissipating apparatus is connected to the testing apparatus.

10. A method for testing a power supply, comprising the steps of:
    preparing at least two resistance matching selectors each of which comprises at least two resistance units therein, and each of said at least two resistance matching selectors capable of selectively simulating more than two resistive loads for a power supply to be tested;
    electrically connecting said at least two resistance matching selectors with said power supply respectively;
    applying a selective one of said & least two resistance matching selectors onto said power supply based on a character of said power supply, and
    verifying result signals from said selective one of said at least two resistance matching selectors.

11. The method as claimed in claim 10, wherein each of said at least two resistance units is a shunt-wound resistance unit and comprises a switch and a resistance connected with said switch in series.

12. The method as claimed in claim 11, wherein an end of said switch other than connected with said resistance is electrically connected to said power supply, and an end of said resistance other than connected with said switch is grounded.

13. The method as claimed in claim 10, wherein a multiway switch is used to effectively apply said selective one of said at least two resistance matching selectors onto said power supply in said applying step.

14. The method as claimed in claim 13, further comprising the step of providing a detecting and displaying apparatus electrically connected to said multiway switch to be used to detect and display parameters of voltages, current, and power of said power supply.

15. The method as claimed in claim 10, further comprising the step of providing a heat dissipating apparatus for cooling said at least two resistance matching selectors.

16. The method as claimed in claim 10, further comprising the step of providing a linking apparatus electrically connected between said power supply and said at least two resistance matching selectors.

* * * * *